(12) United States Patent
Kawakubo et al.

(10) Patent No.: US 6,533,906 B2
(45) Date of Patent: Mar. 18, 2003

(54) METHOD OF MANUFACTURING AN OXIDE EPITAXIALLY STRAINED LATTICE FILM

(75) Inventors: Takashi Kawakubo, Yokohama (JP); Takaaki Yasumoto, Kawasaki (JP); Kazuhide Abe, Kawasaki (JP); Naoko Yanase, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 39 days.

(21) Appl. No.: 09/795,479

(22) Filed: Mar. 1, 2001

(65) Prior Publication Data

US 2001/0027167 A1 Oct. 4, 2001

(30) Foreign Application Priority Data

Mar. 28, 2000 (JP) ......................................... 2000-089191

(51) Int. Cl.$^7$ ............................ C23C 14/34; C23C 14/35
(52) U.S. Cl. ............................... 204/192.22; 204/192.12
(58) Field of Search ........................ 204/192.12, 192.22, 204/298.11, 298.16, 298.06, 298.12, 298.28

(56) References Cited

U.S. PATENT DOCUMENTS

| | | | | |
|---|---|---|---|---|
| 3,887,451 A | * | 6/1975 | Cuomo et al. | 204/192 |
| 5,510,011 A | * | 4/1996 | Okamura et al. | 204/192.3 |
| 5,739,563 A | | 4/1998 | Kawakubo et al. | 257/295 |
| 5,747,427 A | * | 5/1998 | Homma et al. | 505/476 |
| 5,760,432 A | | 6/1998 | Abe et al. | 257/295 |
| 6,077,406 A | | 6/2000 | Kawakubo et al. | 204/298.12 |

* cited by examiner

*Primary Examiner*—Steven H. VerSteeg
(74) *Attorney, Agent, or Firm*—Oblon, Spivak, McClelland, Maier & Neustadt, P.C.

(57) ABSTRACT

A method of manufacturing an epitaxially-strained lattice film of an oxide, in which epitaxially-strained lattices having a good crystalline property are formed by applying RF power to a substrate holder and irradiating positive ions having a moderate energy while preventing damage to the strained lattice film to be stacked by oxygen negative ions. This method simultaneously overcomes both the problem of damage to the film by irradiation of oxygen negative ions, which is peculiar to sputtering of oxides, and the problem of failure to strain due to relaxation of the strain during deposition.

11 Claims, 9 Drawing Sheets

METHOD OF MANUFACTURING AN OXIDE EPITAXIALLY STRAINED LATTICE FILM

BACKGROUND OF THE INVENTION

1. Field of the Invention

The present invention relates to a method of manufacturing an oxide epitaxially-strained lattice film, and more particularly to a method of manufacturing an oxide dielectric device using an epitaxial dielectric film made of a dielectric material having a perovskite crystalline structure, or the like.

2. Related Art

Recently, storage devices using ferroelectric thin films (ferroelectric memory devices) as storage mediums have been developed, and some of them have been brought into practice. Ferroelectric memory devices have the advantages that they are nonvolatile, therefore maintain the storage even after removal of power, quick in spontaneous polarization reversal, when having a sufficiently thin film thickness, and are therefore available for quick write and read equivalent to those of DRAM. Additionally, since each one-bit memory cell can be made of a single transistor and a single ferroelectric capacitor, they are suitable for realization of larger capacities.

Ferroelectric thin films for use in ferroelectric memory devices are required to have properties: remanent polarization being large, dependency of remanent polarization upon temperature being small, remanent polarization being maintained for a long time (retention), among others.

Currently, lead zirconate titanate (PZT) is mainly used as a ferroelectric material. However, regardless of its high Curie temperature (300° C. or higher) and large spontaneous polarization, its major component, Pb, is liable to disperse and vaporize at relatively low temperatures (for example, 500° C.), and this material is estimated to be difficult to cope with miniaturization.

Under the circumstances, the Inventors found and now recognize that the c-axis length of BST can be artificially controlled by selecting strontium titanate ($SrTiO_3$, which may be called STO hereinbelow) single crystal as the substrate, strontium ruthenate ($SrRuO_3$, which may be called SRO hereinbelow), for example, as the lower electrode, and a material having a slightly larger lattice constant than that of SRO, such as barium strontium titanate ($Ba_xSr_{1-x}TiO_3$, which may be called BST hereinbelow) as the dielectric material, and by epitaxially growing all, employing a deposition method that is more effective in preventing misfit-dislocation in the process of deposition of film by RF magnetron sputtering such that the epitaxial effect maintains BST as a strained lattice even when the film is relatively thick as large as 200 nm or more (see Japanese Patent Publication No. 2878986). As a result, it has been confirmed that, by using BST having a Ba-rich composition, it is possible to realize a ferroelectric thin film quite desirable as ferroelectric memory (which may be called FRAM hereinbelow), which can shift the ferroelectric Curie temperature toward a higher side, exhibit a large remanent polarization at room temperatures and maintain a sufficiently large remanent polarization even when the temperature is raised to about 85° C. Thus, FRAM can be made by using a thin-film capacitor having an epitaxially grown, ferroelectric thin film, and its practical availability is expected.

However, through various researches about methods of making epitaxially-strained lattice ferroelectric thin films, the Inventors have come to the realization that serious difficulty still exists in uniformly making a large dimension of epitaxial ferroelectric film having good crystalline property and ferroelectric property.

The "strain" in the term "strained lattice" used herein has a meaning different from the "strain" naturally introduced into the lattice as a result of appearance of ferroelectricity. For example, barium titanate ($BaTiO_3$) has a cubic structure of a paraelectric substance at temperatures higher than the Curie temperature (approximately 130° C.), and all of its a-axis, b-axis and c-axis are 4.01 Å. At the Curie temperature, however, that structure changes to a tetragonal structure due to ferroelectric phase transformation, which results in contraction of the a-axis and the b-axis by approximately 0.005 Å and expansion of the c-axis by 0.01 Å. This type of change is often called a distortion caused by ferroelectricity, but it is different from the strain in the context of the present invention. The strain used in the present invention means a rather artificial strain caused by a restriction that a crystal lattice having such a naturally introduced distortion receives from the substrate while epitaxial growth progresses.

[Prior Art 1]

FIG. 1 is a layout diagram of a well-known parallel-flat RF sputtering apparatus. Numeral 101 denotes a substrate holder, 102 refers to a substrate, and 103 to a cathode. The cathode 103 is made up of a target 105, backing plate 106, magnet 107 and yoke 108. A magnetic field as shown by lines of magnetic force 109 is generated by the magnet 107. Using that apparatus, using $BaTiO_3$ ceramic as the target for a ferroelectric film and $SrRuO_3$ ceramic as the target for an upper or lower electrode, using a single-crystal $SrTiO_3$ substrate as the substrate 102, setting the substrate temperature at 600° C., supplying Ar and $O_2$ by the ratio of 4:1 to adjust the total pressure at 0.25 Pa, the $SrRuO_3$ lower electrode, $BaTiO_3$ ferroelectric film and $SrRuO_3$ upper electrode were stacked in this order to the thicknesses of 30 nm, 40 nm and 30 nm, respectively, on the $SrTiO_3$ substrate. RF power supplied was 300 W for all of the targets. With the $BaTiO_3$ ferroelectric film obtained, its lattice constant was measured, and the relations between c-axis lengths and substrate positions were collected as shown in FIG. 2. Substrate positions were shown by angles θ from the region of the target to be sputtered, which is shown in FIG. 1 and called an erosion region 104. As shown in FIG. 2, epitaxial growth did not occur at the substrate position opposed to the erosion region, i.e., the position where θ is near 0, and its c-axis value could not be measured. On the other hand, at positions distant from the position opposed to the erosion region, where θ is larger than about 15 degrees, epitaxial growth occurs, and the c-axis value increases from the original bulk c-axis value. That is, lattice mismatch with the substrate is maintained without being relaxed by crystal defects, and a strained lattice is made. As shown in FIG. 2, the c-axis exhibited the maximum value, and a very strong ferroelectricity was observed near the portion where the angle θ from the erosion region was about 20 degrees.

As reviewed above, if a typical parallel-flat RF sputtering apparatus is used, then the crystalline property is damaged at the portion opposed to the erosion region, and strained lattices are made merely in offset regions distant by a certain value from the position opposed to the erosion region because of improvement of the crystalline property. Therefore, ferroelectric capacitors having good ferroelectric characteristics cannot be made uniformly all over a substrate with the existing apparatus alone.

That phenomenon is known as damaging effect of oxygen negative ions, which occurs during sputtering of oxides (see, for example, D. J. Kester and R. Messier; J. Vac. Sci. Technol., A4–3(1986), 496 or K. Tominaga, N. Ueshiba, Y. Shintani and O. Tada; Jap. J. Appl. Phys., 20–3(1981), 519). This is shown in a schematic diagram of FIG. 3. When RF power 306 is supplied to the target 301, the target is negatively charged with respect to the plasma potential, and a strong electric field 307 is generated in the plasma sheath portion. Ar positive ions 304 in the plasma 303 are accelerated by the electric field 307 of the plasma sheath portion, hit the surface of the target 301, thereby bash out atoms forming the target by a sputtering action and can stack them on the substrate 302 located in confrontation with the target. However, in case the target is an oxide like $BaTiO_3$, sputtered oxygen is liable to become negative ions 305, and since these oxygen ions are negatively charged, they are accelerated by the electric field 307 of the plasma sheath portion toward the substrate away from the target, rather sputter the substrate plane, and damage the crystal grown on the substrate. This is the most possible assumption. Since those oxygen negative ions are accelerated vertically of the target, they seriously damage the portion opposed to the erosion region. On the other hand, particles sputtered from the target spread over a relatively wide area, and it is considered that a ferroelectric film having a good crystalline property stacks on the region distant from the erosion-opposed portion.

To prevent damage by oxygen negative ions produce by sputtering of an oxide, there are roughly two groups of methods. Those methods proposed heretofore are explained below.

[Prior Art 2]

One of those methods is to increase the sputtering gas pressure. This method is configured to increase the gas pressure so as to make oxygen negative ions accelerated by an electric field hit the gas and disperse, thereby to decrease the kinetic energy below the threshold value causing damage to the crystal grown.

The Inventors conducted an experiment in which only the sputtering gas pressure was raised by using the same apparatus and the material as those of the [Prior Art 1]. With the $BaTiO_3$ ferroelectric film obtained, its lattice constant was measured, and the relations between c-axis lengths and substrate positions were collected as shown in FIG. 4. As the gas pressure is raised from 0.25 Pa, the epitaxially grown region gradually expands, and the position where the c-axis length exhibits the peak value approaches the erosion region, and in case of 10 Pa, it exhibits the maximum value just above the erosion region. When the gas pressure is further raised to 25 Pa, epitaxial growth takes place in the entire region; the c-axis does not extend substantially any more.

Increasing the gas pressure in this manner gives certain effects in preventing the damaging effect of oxygen negative ions and enabling epitaxial growth over the entire area. However, even when the gas pressure is optimized, a considerable distribution of the c-axis length remains. Namely, there remains the characteristic that the c-axis length reaches the maximum value at a position at a specific distance from the position opposed to the erosion region, and decreases as moving away from the position. Additionally, changes of the ferroelectric property are confirmed to larger than changes of c-axis value through measurement. Therefore, although this technique gives a certain effect, it does not satisfy the required specification because of fluctuation of the characteristics when manufacturing a ferroelectric memory uniformly over a semiconductor substrate with a large area.

[Prior Art 3]

The second method used heretofore to prevent damage by oxygen negative ions is off-axis sputtering in which the substrate is located offset from vertically above the target surface from which the oxygen negative ions are radiated. This method relies on locating the substrate aside from the target and stacking only sputter particles diagonally radiated from the target.

An example of off-axis sputtering apparatus is shown in FIG. 5. Two targets 503 are located face to face, and a substrate 502 is disposed at the center between the two targets to incline by 90 degrees from the target planes. The substrate 502 is fixed on a substrate holder 501, and the targets 503, in combination with backing plates 504 and magnets 505, form cathodes. A magnetic field as shown by lines of magnetic force 506 is generated by the magnet 505. An experiment was conducted under the same conditions as those of the foregoing Prior Art 1 except for using that apparatus. With the $BaTiO_3$ ferroelectric film obtained, its lattice constant was measured, and the relations between c-axis lengths and substrate positions were collected as shown in FIG. 6. It was confirmed from FIG. 6 that epitaxial growth occurred wherever of the substrate when the apparatus of FIG. 5 was used. However, extension of the c-axis of the obtained film was small, and this demonstrates a structure was obtained in which no strained lattice was formed and the strain was relaxed at the boundary. As reviewed above, locating the targets and the substrate at off-axis positions gives certain effects in preventing the damaging effect of oxygen negative ions and enabling epitaxial growth over the entire area. However, there still remains the problem that a sufficient c-axis length cannot be obtained, that is, strained lattices are not formed sufficiently.

If conventional parallel-flat RF sputtering is used for making epitaxially strained lattices of an oxide, good strained lattices cannot be made because oxygen negative ions seriously damage the portion opposed to the erosion region of the target. In case a high gas pressure atmosphere is introduced into a parallel-flat RF sputtering apparatus or an off-axis sputtering apparatus is used for the purpose of preventing damage by oxygen negative ions, although epitaxial growth is ensured over the entire area of the substrate, from the viewpoint of strained lattices, it is not possible to introduce required strain uniformly over the entire area of the substrate and prevent that the strain is relaxed at the boundary.

The invention has been made to solve the problems discussed above, and to make strained lattices of an oxide uniformly all over the substrate, particularly make strained lattices of a ferroelectric material such as $BaTiO_3$ all over the substrate and thereby enable its use as an excellent ferroelectric capacitor of a semiconductor memory device.

SUMMARY OF THE INVENTION

To attain the object of the invention, the Inventors repeated reviews of Prior Arts, and as a result of new trials, first got the following knowledge.

That is, according to the knowledge the Inventors obtained, in order to ensure that an excellent strained lattice of an oxide is made by sputtering, mere prevention of damage by oxygen negative ions is not sufficient, but it is indispensable to simultaneously irradiate particles having an energy necessary for fabrication of the strained lattice but lower than the energy of damaging particles.

Additionally, unlike the foregoing [Prior Art 2], when the gas pressure is raised progressively, a substrate region where particles having an energy as high as causing damage gradually moves to just above the erosion region, and outside of it, there is a substrate region where particles are adequately scattered and have an energy required for growth of the strained lattice. Thus the Inventors found that an oxide strained lattice with a well-extended c-axis appeared in a specific substrate region, depending upon the gas pressure.

Based on the knowledge first obtained, the Inventors found a method of uniformly fabricating epitaxially strained lattices of an oxide over a substrate having a larger area, as explained below.

That is, according to the invention, there is provided a method of manufacturing an epitaxially-strained lattice film of an oxide on a substrate by sputtering in vapor phase at least a part of film components from a target onto the substrate, comprising:
(1) preventing damage to the strained lattice film by oxygen negative ions; and
(2) stacking the epitaxially strained lattice film while applying RF power to the substrate in order to maintain the DC bias potential of the substrate between +5V and −30V.

According to the first aspect of the invention, there is provided a method of manufacturing an epitaxially-strained lattice film of an oxide on a substrate by sputtering in vapor phase at least a part of film components from a target onto the substrate, comprising:
(1) using a sputtering apparatus having a plurality of targets opposed to the substrate, shield plates located vertically above surfaces of the targets in position fixed with respect to the targets, and a mechanism for relatively rotating the entirety of the targets and the shield plates, and the substrate; and
(2) stacking the epitaxially strained lattice film by sputtering while applying RF power to the substrate in order to maintain the DC bias potential of a substrate holder between +5V and −30V.

According to the second aspect of the invention, there is provided a method of manufacturing an epitaxially-strained lattice film of an oxide on a substrate by sputtering in vapor phase at least a part of film components from a target onto the substrate, comprising:
(1) using an offset or off-axis sputtering apparatus in which the substrate is not positioned in a region vertically above the target plane; and
(2) stacking the epitaxially strained lattice film by sputtering while applying RF power to a substrate in order to maintain the DC bias potential of the substrate holder between +5V and −30V.

According to the third aspect of the invention, there is provided a method of manufacturing an epitaxially-strained lattice film of an oxide on a substrate by sputtering in vapor phase at least a part of film components from a target onto the substrate, comprising:
(1) using a parallel-flat sputtering apparatus in which the substrate and the target are positioned face to face, and when the gas pressure during deposition is P (Pa) and the distance between the substrate and the target is L (mm), maintaining the product of P and L not smaller than 500; and
(2) stacking the epitaxially strained lattice film by sputtering while applying RF power to a substrate in order to maintain the DC bias potential of the substrate holder between +5V and −30V.

DETAILED DESCRIPTION OF THE INVENTION

Figure 1:
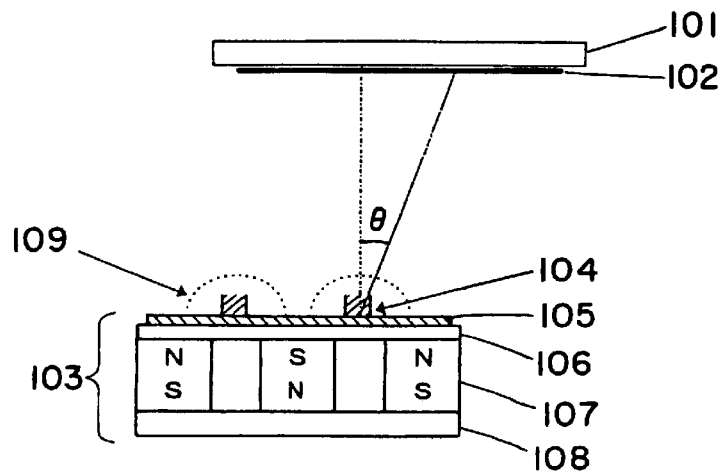
FIG. 1 is a layout diagram of a parallel-flat sputtering apparatus explained in the section of Prior Art 1.
Figure 2:
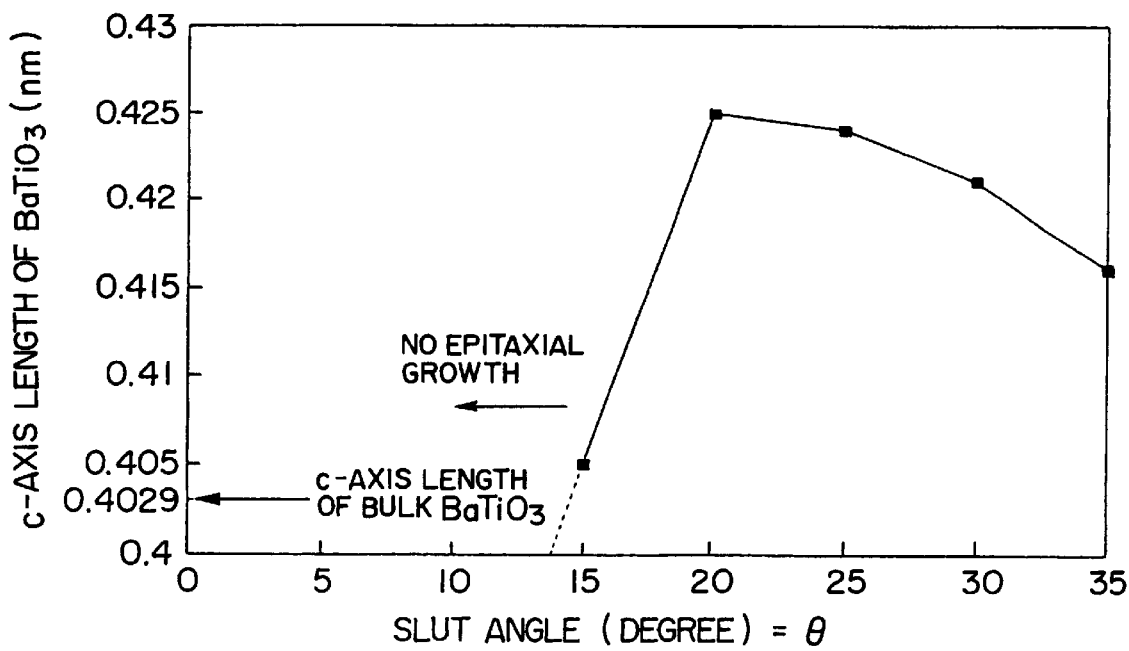
FIG. 2 is a diagram that shows a relation between c-axis values of a ferroelectric film deposited with the apparatus of FIG. 1 and slut angles from an erosion portion of a target.
Figure 3:
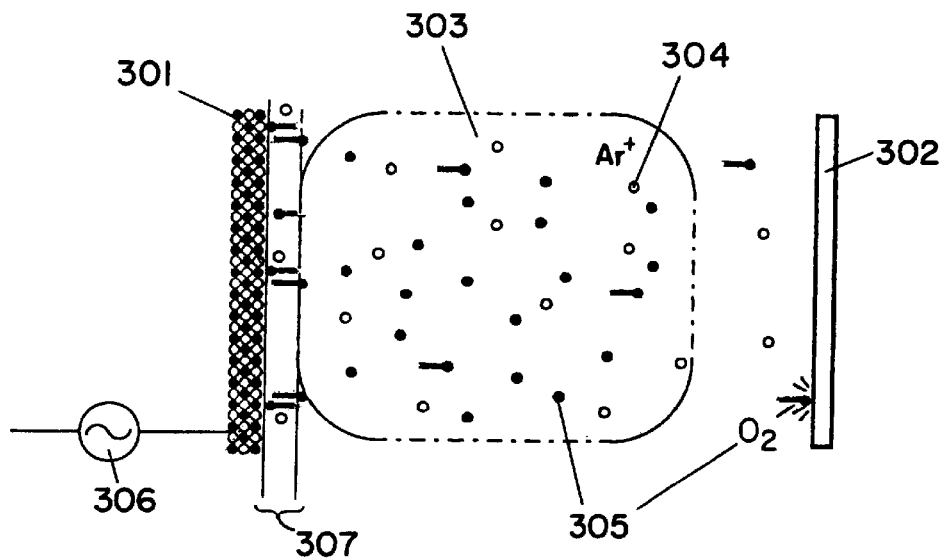
FIG. 3 is a diagram for explaining damage to a substrate by oxygen negative ions during sputtering.
Figure 4:
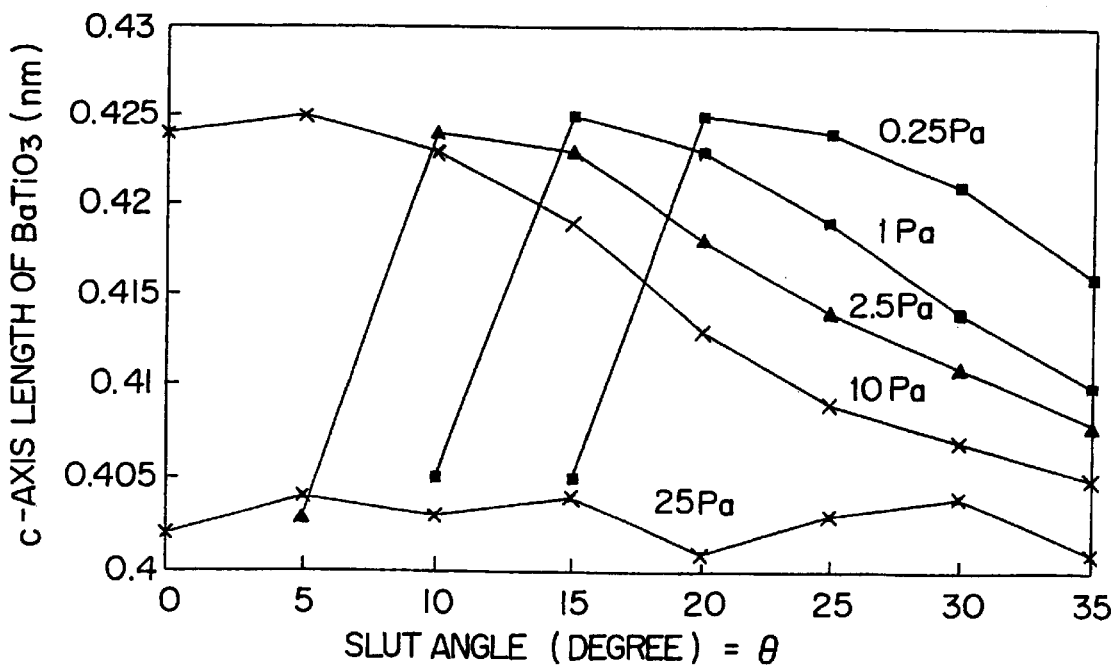
FIG. 4 is a diagram that shows a relation between c-axis values of a ferroelectric film, deposited by the method of Prior Art 2 using the parallel-flat sputtering apparatus shown in FIG. 1 and a high gas pressure atmosphere, and slut angles from an erosion portion of a target.
Figure 5:
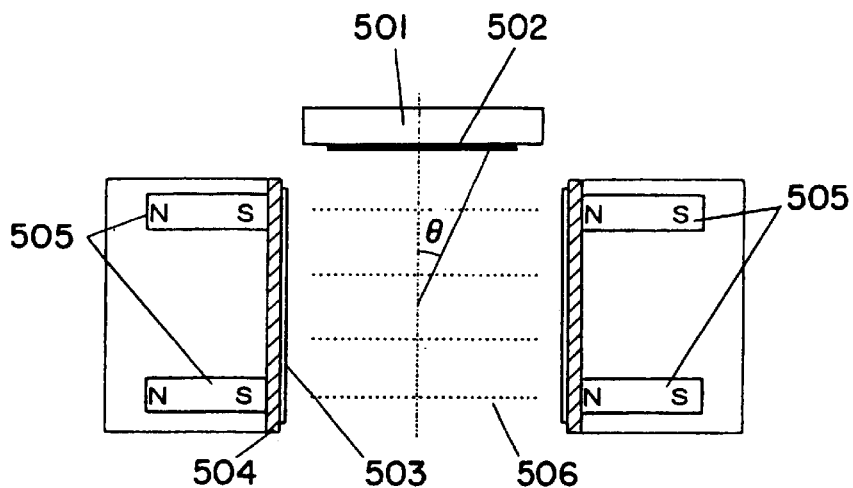
FIG. 5 is a layout diagram of an off-axis sputtering apparatus explained in the section of Prior Art 3.
Figure 6:
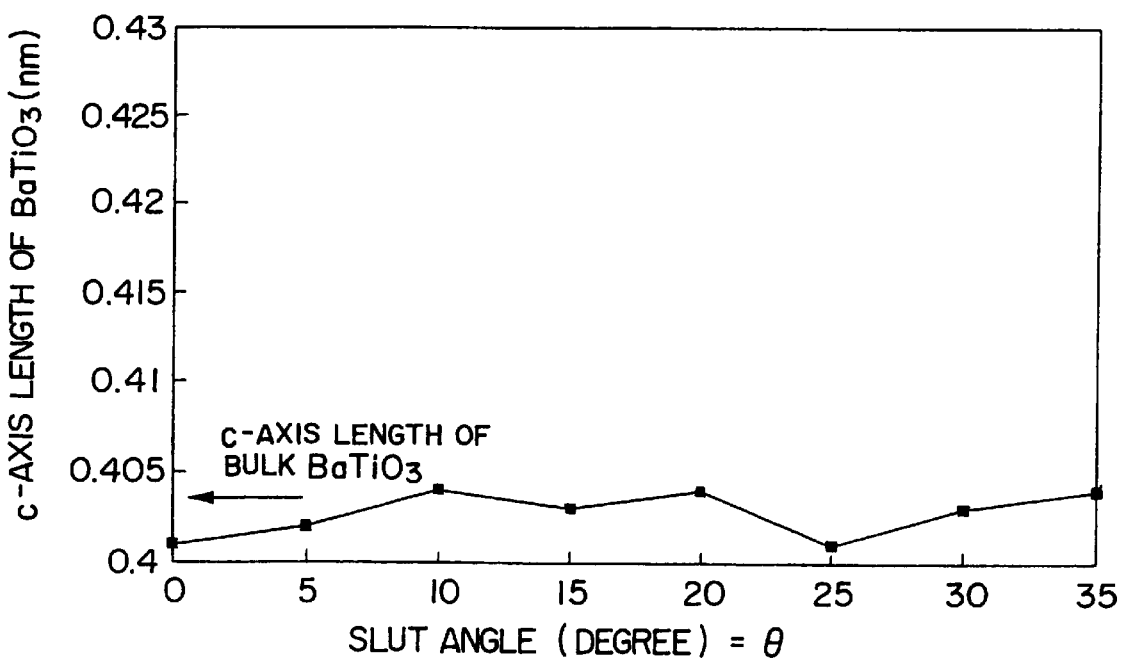
FIG. 6 is a diagram that shows a relation between c-axis values of a ferroelectric film deposited by Prior Art 3 and slut angles from a central portion of the apparatus.

A method of manufacturing an epitaxially-strained lattice film of an oxide according to the invention is characterized in depositing a film of epitaxially-strained lattices of an oxide by simultaneously using (1) a means for preventing damage by oxygen negative ions (or deposition means free from damage by oxygen negative ions) and (2) a means for irradiating particles having an energy required for fabrication of strained lattices.

As (1) means for preventing damage by oxygen negative ions, the first method according to the invention uses multiple targets, provides a shield plate vertically above a target plane, and while thereby preventing high-speed oxygen negative ions from hitting the substrate plane, makes a film with diagonally sputtered components. Therefore, the shield plate preferably has the same flat shape as that of the erosion region of the target, or has a larger area than it. For example, if the target plane (erosion region) is a circular plane, then the shield plate preferably has a radius equal to or larger than the radius of the target plane, and is preferably located concentrically therewith. The target plane need not be flat, but may be spherical. In this case, the shield plate is preferably determined to lie vertically above tangent planes of all points of the target plane.

The second method according to the invention prevents the attack of oxygen negative ions by employing off-axis arrangement where the target plane and the substrate plane are slanted, or by employing offset arrangement where opposed planes of the target and the substrate are shifted in parallel such that the substrate does not lie vertically above the target plane.

The third method according to the invention prevents damage to the film by oxygen negative ions while using a parallel-flat sputtering apparatus by maintaining the product of the gas pressure P (Pa) of the deposition atmosphere and the distance L (mm) between the target and the substrate above a certain value, and thereby scattering oxygen negative ions having a high energy, i.e. a high speed. The product of P and L is normally not smaller than 500, and preferably not smaller than 1000. P and L may be any numerical values within that range, but L is preferably in the range of 10 to 500 mm from the viewpoint of the size and strength of the apparatus.

As the means for irradiating low-speed particles necessary for making strained lattices of (2) above, all methods according to the invention apply RF power to the substrate holder under appropriate control, and irradiate positive ions of Ar, for example, in plasma by using a difference between the plasma potential (+10V through +20V) and the substrate potential. At that time, it is essential that the DC bias potential is not higher than +5V in order to maintain a sufficient energy of positive ions and obtain a sufficient assistant effect for growth of strained lattices. Additionally, in order to prevent damage of strained lattices due to an excessively large energy of positive ions, it is essential that the DC bias potential is not lower than −30V, and it is preferably not lower than −20V.

It is already known that a film is usually improved in quality by application of a bias to the substrate. Known effects thereof are reduction of influences from mixture of impurities by reverse sputtering of the substrate, a decrease of the deposition temperature by promoting migration of atoms of the surface and improvement of evenness of the surface. The effect first found by the invention, namely, the effect of fabricating strained lattices has not been known at all, and no Prior Arts using it in fabrication of a strained lattice film are found.

In addition, most of crystals having been fabricated as strained lattices or strained superlattices are those using lattice mismatch between Si crystal and Si/Ge crystal and compound semiconductors of GaAs and (Ga, Al)As. Both are made by vapor deposition like molecular epitaxial growth (MBE) or metal-organic chemical vapor deposition (MOCVD), which can be said to be static deposition methods in which the kinetic energy of stacked particles is not higher than 0.1 eV. Particles having a kinetic energy not lower than several eV are considered to rather have influences of destructing strained lattices.

In any method according to the invention, a magnetic field can be applied to near the substrate by using a permanent magnet or an electromagnet for the purpose of increasing the density of plasma near the substrate.

It is also possible to prevent interference and enhance the controllability by applying RF powers of different frequencies to the target and the substrate holder.

Furthermore, instead of connecting the RF power source directly to the substrate holder and applying the RF power, it is possible to connect to the substrate holder a matching circuit made up of a coil and a capacitor and use the RF power excited by induction from an RF power applied to another electrode, such as that applied to the target, to control the DC bias potential of the substrate target.

As an additional matter, the surface of the substrate made of an insulator cannot be controlled to 0 V by mere ground connection without supplying an RF power to the substrate holder. Although the substrate holder made of an electrically conductive material is 0 V, the substrate, or the film surface, made of an insulator, is electrically non-conductive with the substrate holder, and does not become equal in potential. Only by applying the RF power, interaction with particles having positive or negative charge in the plasma can be controlled. That is, the substrate surface is held in a potential at which positive charge and negative charge incident to the substrate surface (=surface of the substrate holder) become equal when a certain RF power is applied. Therefore, by controlling the RF power or RF frequency, the potential of the surface of the insulator substrate can be controlled.

In any method according to the invention, the substrate is preferably heated or held at a temperature during deposition of a film. The heating temperature depends upon the deposition condition and others. However, since temperatures above the threshold value for epitaxial growth make epitaxial growth easy, the heating temperature is preferably not lower than 350° C., and more preferably not lower than 450° C. A lamp heater, or the like, can be located at the back surface of the substrate as means for heating or keeping it hot.

The strained lattice film manufactured by any method according to the invention is used as a ferroelectric capacitor, for example. Therefore, since the ferroelectricity and the Curie temperature can be increased under a large strain, the c-axis length Ce of the epitaxially-strained lattice film after epitaxial growth and the c-axis length of a tetragonal structure or a-axis length of a cubic structure, Co, preferably satisfy the relation of Ce/Co≧1.01, and more preferably satisfy the relation of Ce/Co≧1.02.

Additionally, methods according to the invention are especially suitable when the epitaxially strained lattice film of an oxide has a perovskite structure or a layered perovskite structure.

Methods according to the invention are especially suitable when the epitaxially strained lattice film of an oxide is a ferroelectric film having a perovskite structure containing $(Ba, Sr, Ca)TiO_3$ as its major component. Those methods according to the invention are applicable to a ferroelectric film containing Pb, such as lead zirconate titanate (PZT). However, in a ferroelectric film of a perovskite structure containing $(Ba, Sr, Ca)TiO_3$ as its major component, because of the reasons that a large amount of oxygen negative ions generated is liable to damage the film and the lattice has a crystallographic hardness and tends to produce a strain, effects of the invention tend to appear remarkably.

Any method of manufacturing an oxide strained lattice film according to the invention is very useful not only for fabrication of a ferroelectric thin-film capacitor but also for fabrication of an oxide thin film used in a magnetoresistive element, for example. Among conductive oxide magnetic materials, so-called composite perovskite conductive oxide magnetic materials having the composition of $A_2BB'O_6$ (A is at least one selected from rare earth elements and alkaline earth elements, and each of B and B' is at least one independently selected from transition metals) has a high spin polarization coefficient and exhibits a magnetic transition point above the room temperature, and it is hopeful as a material of next-generation magneto resistive elements such as GMR and TMR having a high sensitivity. The Inventors are already aware of the fact that by giving the composite perovskite oxide magnetic material a lattice transformation using lattice mismatch with the substrate to control mixture between orbits of B and B' of these substances, it is possible to obtain a higher magnetic transition temperature or obtain a conductivity and a high magnetic transition temperature even with a substance that does not exhibit a conductivity or a ferrimagnetism in its normal bulk (see the specification of Japanese Patent Application No. hei 10-349839). In order to obtain an appropriate lattice transformation in these conductive oxide magnetic films, their deposition condition have to be selected adequately. However, when any of the methods according to the invention is used, a film free from lattice relaxation and having a high crystalline property can be readily obtained, and a magneto resistive element having an excellent magneto resistive changing ratio irrespectively of the film thickness can be made.

EXAMPLES

The invention will be explained in greater detail by way of examples.

Example 1 and Comparative Example 1

Figure 7A:
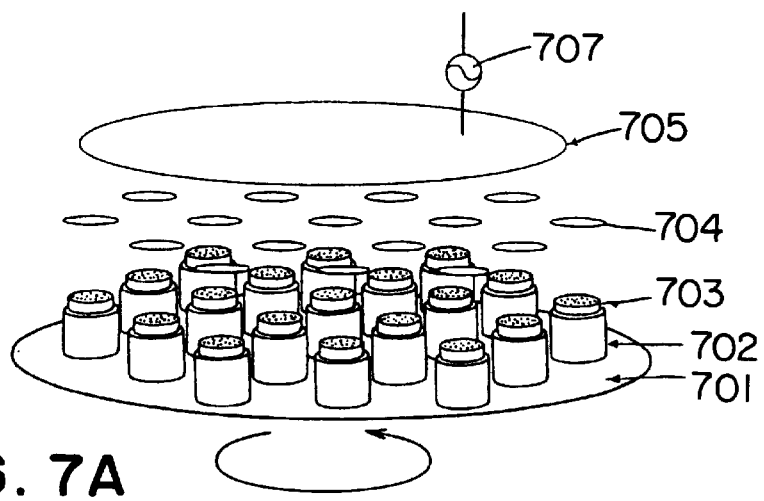
FIGS. 7A through 7C are layout diagrams of a multi-target sputtering apparatus used in Example 1.
Figure 7B:
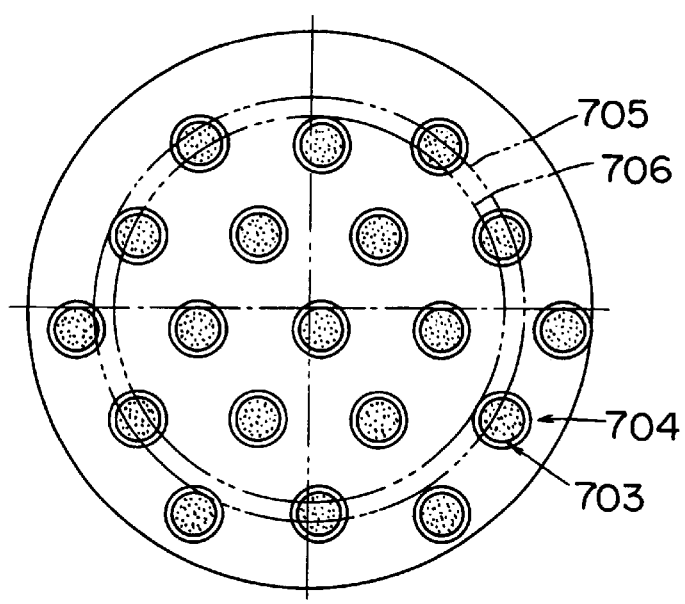
Figure 7C:
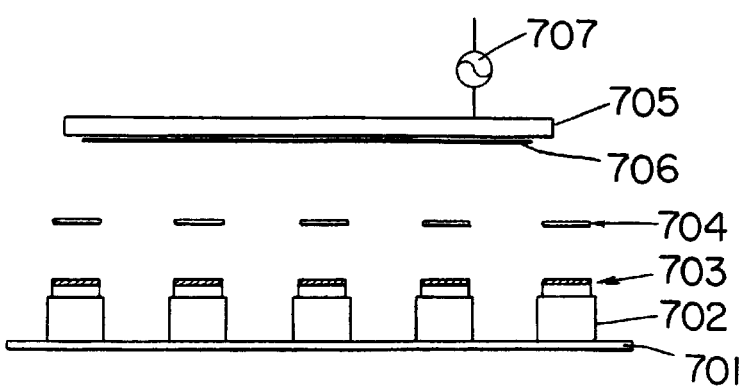

Exemplary layout of a sputtering apparatus used in the method according to the first aspect of the invention is as shown in FIGS. 7A through 7C. FIG. 7A is a bird's-eye view of the entire layout, FIG. 7B is a plan view, and FIG. 7C is an elevational view.

As shown in FIGS. 7A and 7B, nineteen pieces of RF magnetron-type cathodes 702 were arranged in an equilateral triangular formation, carrying disk-shaped targets 703 of the size of 50 mmφ thereon to face to a Si substrate 706 attached to a substrate holder 705 and having the diameter of 200 mm. Vertically above individual targets 703, circular shield plates 704 each having the size of 50 mmφ were provided. These shield plates are fixed to one another by support rods (not shown). Nineteen cathodes are directly coupled to the base plate 701, and the mutually coupled shield plates 704 are attached to the base plate 701 via legs (not shown) such that the base plate 701 rotates together with the cathodes 702 and the shield plates 704 with respect to the substrate 706. The center axis of rotation in this structure was determined at an eccentric position not coinciding with any of center axes of the cathodes to ensure uniform deposition. The support rods connecting the shield plates make a shadow on the substrate holder as viewed from the target, since the base plate relatively rotates, evenness of a film made thereby is ensured. Connected to the substrate holder is an RF power source 707.

Using this apparatus, $BaTiO_3$ as the target for a ferroelectric film, $SrRuO_3$ as the target for an upper or lower electrode, a single-crystal $SrTiO_3$ substrate as the substrate, maintaining the substrate temperature at 600° C., supplying Ar and $O_2$ by the ratio of 4:1 to adjust the total pressure at 0.25 Pa, the $SrRuO_3$ lower electrode, $BaTiO_3$ ferroelectric film and $SrRuO_3$ upper electrode were actually stacked in this order to the thicknesses of 30 nm, 40 nm and 30 nm, respectively, on the $SrTiO_3$ substrate. RF power supplied was 100 W in 13.56 MHz for all of the targets. During deposition of the $BaTiO_3$ dielectric film, RF power of 13.56 MHz was applied to the substrate holder, and under control of the electric energy, the potential of the substrate holder was held between +5V to −30V. As Comparative Example 1, films were made while holding the substrate holder in a floating condition without applying the RF power. At that time, the floating potential of the substrate holder was +15V.

Figure 8:
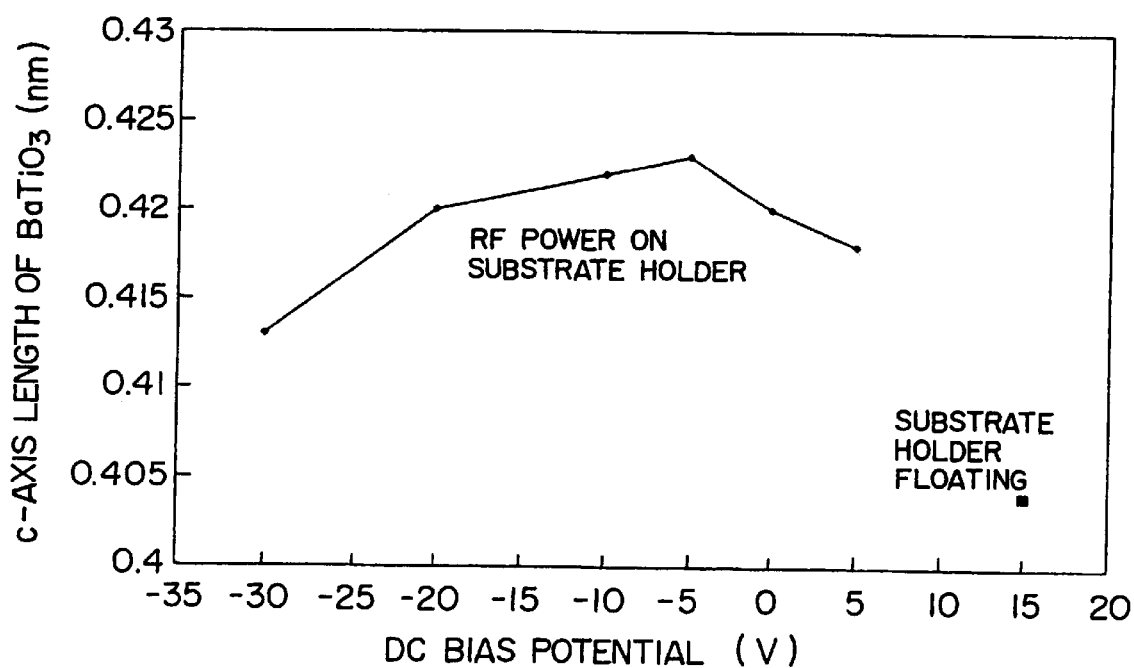
FIG. 8 is a diagram that shows c-axis values of a ferroelectric film deposited by the method of Example 1 and that deposited by the method of Comparative Example 1.

$BaTiO_3$ ferroelectric films made by Example 1 and Comparative Example 1 underwent analysis of crystallographic properties by X-ray diffraction. As a result, a uniform crystallographic property was obtained throughout the substrate. Measured c-axis lengths were as shown in FIG. 8.

In a sample prepared as Comparative Example 1 by making a film in the floating condition without supplying the RF power to the substrate holder, the film was certainly epitaxially grown. However, the film was confirmed to be an epitaxial film with the strain relaxed, in which the c-axis length was approximately 0.404 nm, almost equal to the c-axis value of the bulk, 0.4029 mm. Additionally, as a result of measurement of the dielectric characteristics by processing the sample into the form of a capacitor, it exhibited a paraelectric property, and no hysteresis peculiar to ferroelectric materials was measured.

On the other hand, in samples prepared by making a film while additionally applying a DC bias potential of +5V through −30V to the substrate holder, an epitaxial film having only the c-axis vertical of the substrate plane was made, and the c-axis value exhibited 0.412 through 0.423 in response to the applied voltage values. It was thus confirmed that a strained lattice with the c-axis value extended by 2% from the c-axis value of the bulk, 0.4029, was certainly formed. Especially, application of a DC bias potential in the range from +5V to −20V was effective. Additionally, as a result of measurement of the dielectric characteristics by processing the sample into the form of a capacitor, hysteresis based on the ferroelectricity was observed in all samples, and in samples prepared by applying −5V, very excellent ferroelectricity having remanent polarization value of 2Pr= 72 $\mu C/cm^2$ and cohesive voltage of 0.7V was observed.

The apparatus of FIGS. 7A through 7C is preferably is set to lie horizontally to lay the rotation axis of the base plate horizontally for the purpose of prevent contamination of the substrate or cathodes by particles.

Comparative Example 2

Using the same method as that of Example 1 except for the use of a sputtering apparatus omitting the shield plates, support rods and legs, films were deposited actually. $BaTiO_3$ ferroelectric films, obtained, underwent analysis of crystallographic properties by X-ray diffraction. As a result epitaxial growth did not occur anywhere on the substrate, and c-axis values were not measured. Further, by measurement of the dielectric characteristics by processing the samples in form of a capacitor, due to much leak, ferroelectricity could not be measured either.

Example 2

Figure 9A:
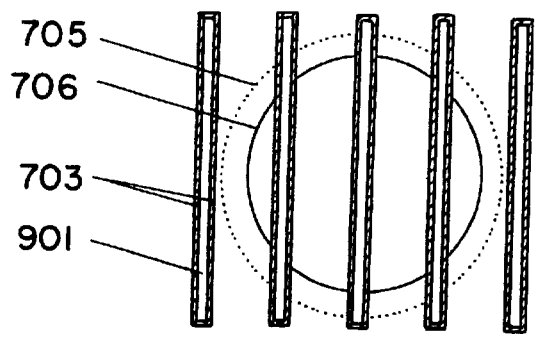
FIGS. 9A through 9C are diagrams that show a layout of an off-axis sputtering apparatus and configuration of cathodes used in Example 2.
Figure 9B:
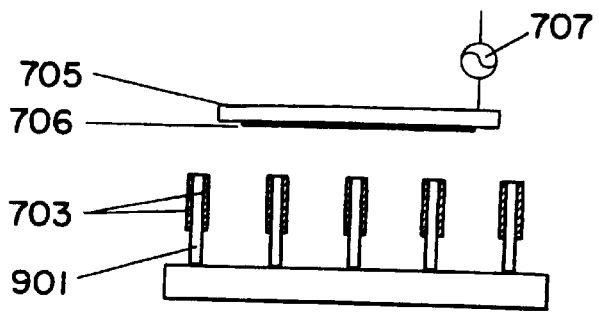
Figure 9C:
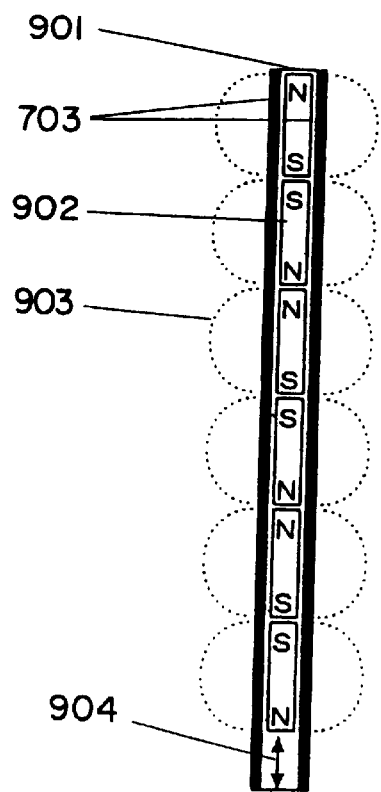

FIGS. 9A through 9C show a layout of an off-axis sputtering apparatus used in the first method according to the second aspect of the invention. FIG. 9A is a plan view of the entirety, FIG. 9B is an elevational view, and FIG. 9C is a diagram that shows the interior structure of a single cathode.

As shown in FIGS. 9A and 9B, five cathodes, each made of a backing plate 901 with two targets 703 of the size of 200×50×5 mm attached on opposite sides, were arranged in 50 mm intervals, face to face with a Si substrate 706 attached to a substrate holder 705 and having the diameter of 150 mm.

As appreciated from FIG. 9C, inside the packing plate 901, six neodymium-iron-boron permanent magnets 902 having the size of 30×60×3 mm were contained, and their magnetized directions were set to be parallel to the target plane and the substrate plane and be opposite between adjacent magnets such that the line of magnetic force 903 formed a closed magnetic field near each cathode as illustrated. Further, each backing plate contains therein a magnet moving mechanism 904 for reciprocally moving the entirety of the permanent magnets in the lengthwise direction of the cathodes.

Using this apparatus, $BaTiO_3$ as the target for a ferroelectric film, $SrRuO_3$ as the target for an upper or lower electrode, a single-crystal SrTiO₃ substrate as the substrate, maintaining the substrate temperature at 600° C., supplying Ar and O₂ by the ratio of 4:1 to adjust the total pressure at 0.25 Pa, the SrRuO₃ lower electrode, BaTiO₃ ferroelectric film and SrRuO₃ upper electrode were actually stacked in this order to the thicknesses of 30 nm, 40 nm and 30 nm, respectively, on the SrTiO₃ substrate. RF power supplied was 100 W in 13.56 MHz for all of the targets. During deposition of the BaTiO₃ dielectric film, RF power of 13.56 MHz was applied to the substrate holder, and under control of the electric energy, the potential of the substrate holder was held at −5V.

BaTiO₃ ferroelectric films, obtained, underwent analysis of crystallographic properties by X-ray diffraction. As a result, a uniform crystallographic property was obtained throughout the substrate, and the c-axis exhibited the substantially constant value of 0.422 nm anywhere on the substrate, and it was thus confirmed that a strained lattice with the c-axis value extended by 5% from the c-axis value of the bulk, 0.4029 nm, was certainly formed. Additionally, as a result of measurement of the dielectric characteristics by processing the sample into the form of a capacitor, a very excellent hysteresis curve having remanent polarization value of 2Pr=68 $\mu$C/cm² and cohesive voltage of 0.6V was observed.

Example 3

Figure 10A:
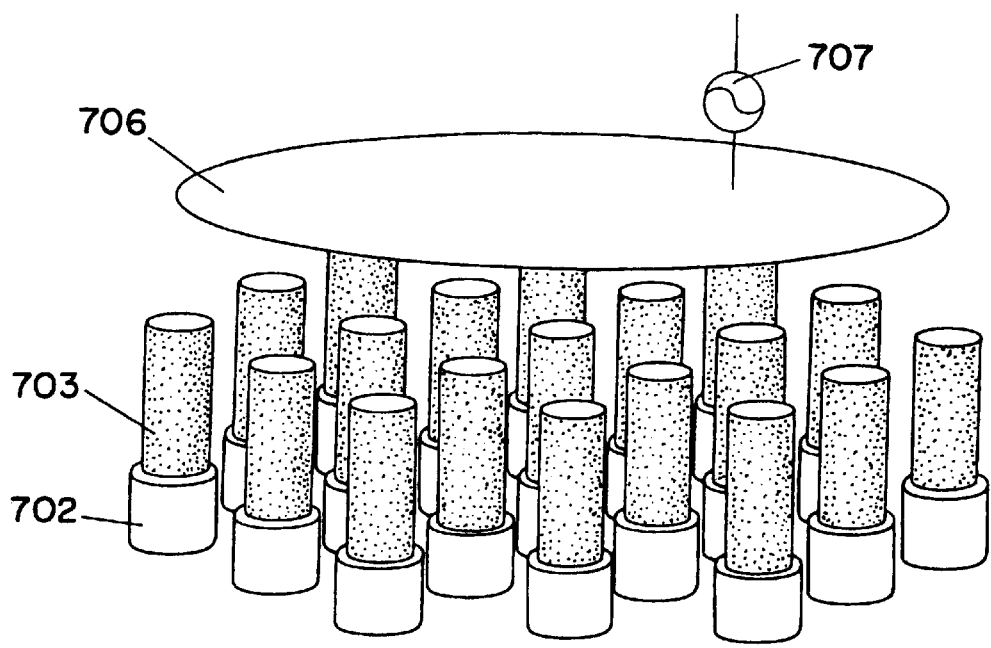
FIGS. 10A and 10B are diagrams that show a layout of an off-axis sputtering apparatus and configuration of cathodes used in Example 3.
Figure 10B:
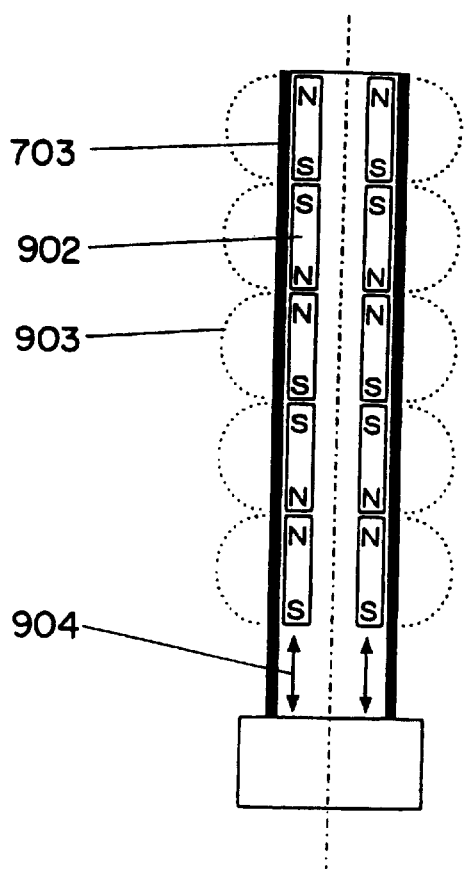

Exemplary layout of a sputtering apparatus used in the second method according to the second aspect of the invention is as shown in FIGS. 10A and 10B. FIG. 10A shows the entire aspect of the apparatus, and FIG. 10B shows the interior structure of a single cathode. Some components including a cooling device are omitted from illustration. This example is of an off-axis type in which the axis of each cylindrical cathode and the axis of the substrate are aligned in parallel to always orient the substrate plane and the target plane vertically.

As shown in FIG. 10A, nineteen cathodes 702, each having a target 703 with the outer diameter 26 mm and the length of 100 mm, were arranged in an equilateral triangular formation at 50 mm intervals, face to face with a Si substrate 706 having the diameter of 150 mm.

As appreciated from FIG. 10B, inside the backing plate 901, five neodymium-iron-boron permanent magnets 902 each having the outer diameter of 15 mm and the length of 18 mm were contained, and their magnetized directions were set to be parallel to the cathode axes and be opposite between adjacent magnets such that the line of magnetic force 903 formed a closed magnetic field near each cathode as illustrated. Further, each backing plate contains therein a magnet moving mechanism 904 for reciprocally moving the entirety of the permanent magnets in the lengthwise direction of the cathodes.

Using this apparatus, BaTiO₃ as the target for a ferroelectric film, SrRuO₃ as the target for an upper or lower electrode, a single-crystal SrTiO₃ substrate as the substrate, maintaining the substrate temperature at 600° C., supplying Ar and O₂ by the ratio of 4:1 to adjust the total pressure at 0.25 Pa, the SrRuO₃ lower electrode, BaTiO₃ ferroelectric film and SrRuO₃ upper electrode were actually stacked in this order to the thicknesses of 30 nm, 40 nm and 30 nm, respectively, on the SrTiO₃ substrate. RF power supplied is 30 W in 13.56 MHz for all of the targets. During deposition of the BaTiO₃ dielectric film, RF power of 13.56 MHz was applied to the substrate holder, and under control of the electric energy, the potential of the substrate holder was held at −5V.

BaTiO₃ ferroelectric films, obtained, underwent analysis of crystallographic properties by X-ray diffraction. As a result, a uniform crystallographic property was obtained throughout the substrate, and the c-axis exhibited the substantially constant value of 0.420 nm anywhere on the substrate, and it was thus confirmed that a strained lattice with the c-axis value extended by 4.5% from the c-axis value of the bulk, 0.4029 nm, was certainly formed. Additionally, as a result of measurement of the dielectric characteristics by processing the sample into the form of a capacitor, a very excellent hysteresis curve having remanent polarization value of 2Pr=69 $\mu$C/cm² and cohesive voltage of 0.6V was observed.

Figure 12:
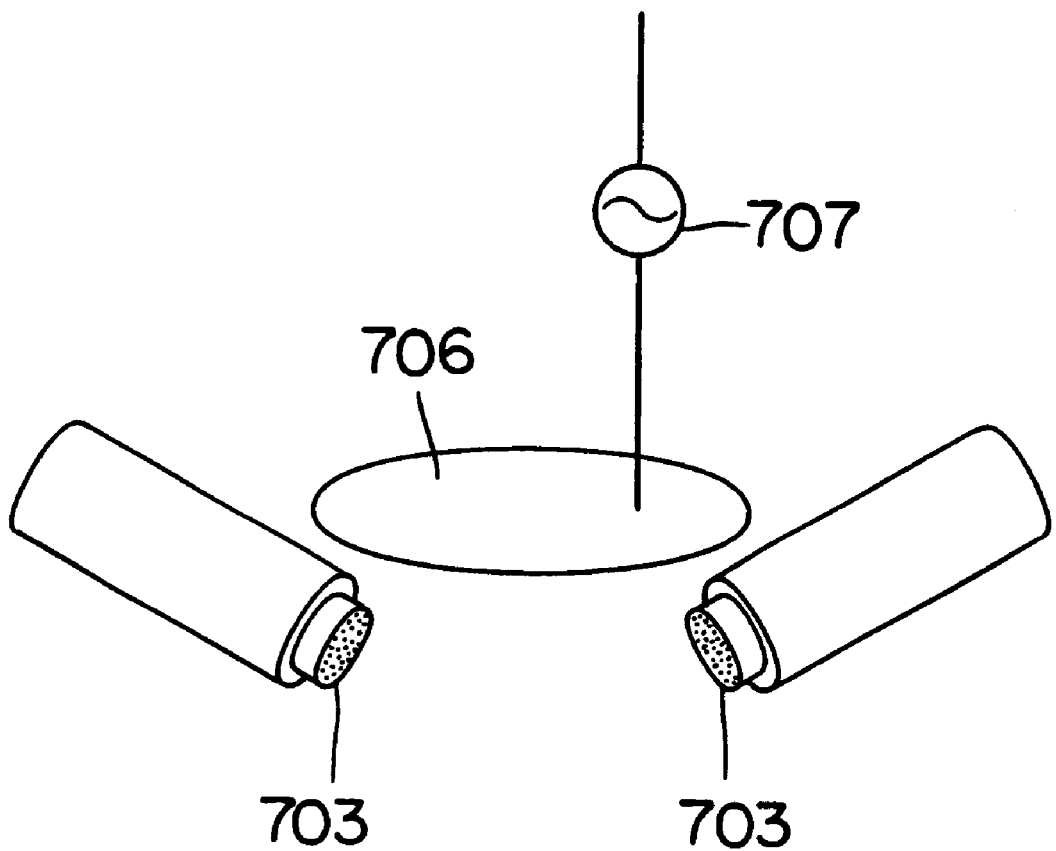
FIG. 12 is a layout diagram of an off-axis sputtering apparatus usable in a method according to the invention.

This example has been shown as using the apparatus shown in FIGS. 9A through 9C or that shown in FIGS. 10A and 10B as the off-axis sputtering apparatus used in the second aspect of the invention. Instead, an apparatus as shown in FIG. 12 can be used. However, some components including a cooling device are omitted from illustration. This is an off-axis sputtering apparatus in which the substrate and the cathodes are disposed such that normal lines from their planes make an acute angle. Because of such an acute angle made by normal lines from the substrate surface and the cathode planes, oxygen negative ions radiated from cathodes are less likely to damage the substrate surface.

Example 4

For the method of making a film in an example according to the third aspect of the invention, a typical parallel-flat RF sputtering apparatus as explained in the section of Prior Art 1 and shown in FIG. 1 can be used. This is an example where a film was stacked by raising the gas pressure by approximately two orders and applying an appropriate substrate bias during deposition.

Using the apparatus show in FIG. 1, BaTiO₃ as the target for a ferroelectric film, SrRuO₃ as the target for an upper or lower electrode, a single-crystal SrTiO₃ substrate as the substrate, maintaining the substrate temperature at 60° C., supplying Ar and O₂ by the ratio of 4:1 to adjust the total pressure at 0.25 Pa, the SrRuO₃ lower electrode, BaTiO₃ ferroelectric film and SrRuO₃ upper electrode were actually stacked in this order to the thicknesses of 30 nm, 40 nm and 30 nm, respectively, on the SrTiO₃ substrate. During deposition of the SrRuO₃ lower electrode and upper electrode, the total pressure was set at 1 Pa, and during deposition of the BaTiO₃, the total pressure was set at 20 Pa, which were higher by 0.25 Pa than that of Prior Arts. When the distance L between the target and the substrate was 100 mm, the product of the total pressure P and L was 2000. RF power supplied is 100 W in 13.56 MHz for the targets. During deposition of the BaTiO₃ dielectric film, RF power of 13.56 MHz was applied to the substrate holder, and under control of the electric energy, the potential of the substrate holder was held at −5V. BaTiO₃ ferroelectric films, obtained, underwent analysis of crystallographic properties by X-ray diffraction. As a result, a uniform crystallographic property was obtained throughout the substrate, and the c-axis exhibited the substantially constant value of 0.421 nm anywhere on the substrate, and it was thus confirmed that a strained lattice with the c-axis value extended by 4.6% from the c-axis value of the bulk, 0.4029 nm, was certainly formed. Additionally, as a result of measurement of the dielectric characteristics by processing the sample into the form of a capacitor, a very excellent hysteresis curve having remanent polarization value of 2Pr=83 $\mu$C/cm² and cohesive voltage of 0.9V was observed.

Example 5

This is an example of application of the invention applied to ferroelectric memory (FRAM) as a semiconductor device.

FIGS. 11A through 11D are cross-sectional views that schematically show a process of manufacturing a ferroelectric memory cell. Numeral 1101 denotes a first conductive type semiconductor substrate, 1102 refers to a layer separation oxide film, 1103 to a gate oxide film, 1104 to a word line, 1105 to a single-crystal Si epitaxial growth layer, 1106 to a second conductive type impurity diffusion layer, 1107, 1109 and 1118 to insulating films, 1108 to a bit line, 1112 to a barrier metal, 1113 to a lower electrode, 1114 to a dielectric thin film, 1115 to an upper electrode, 1116 to a drive line, and 1117 to a via plug.

Figure 11:
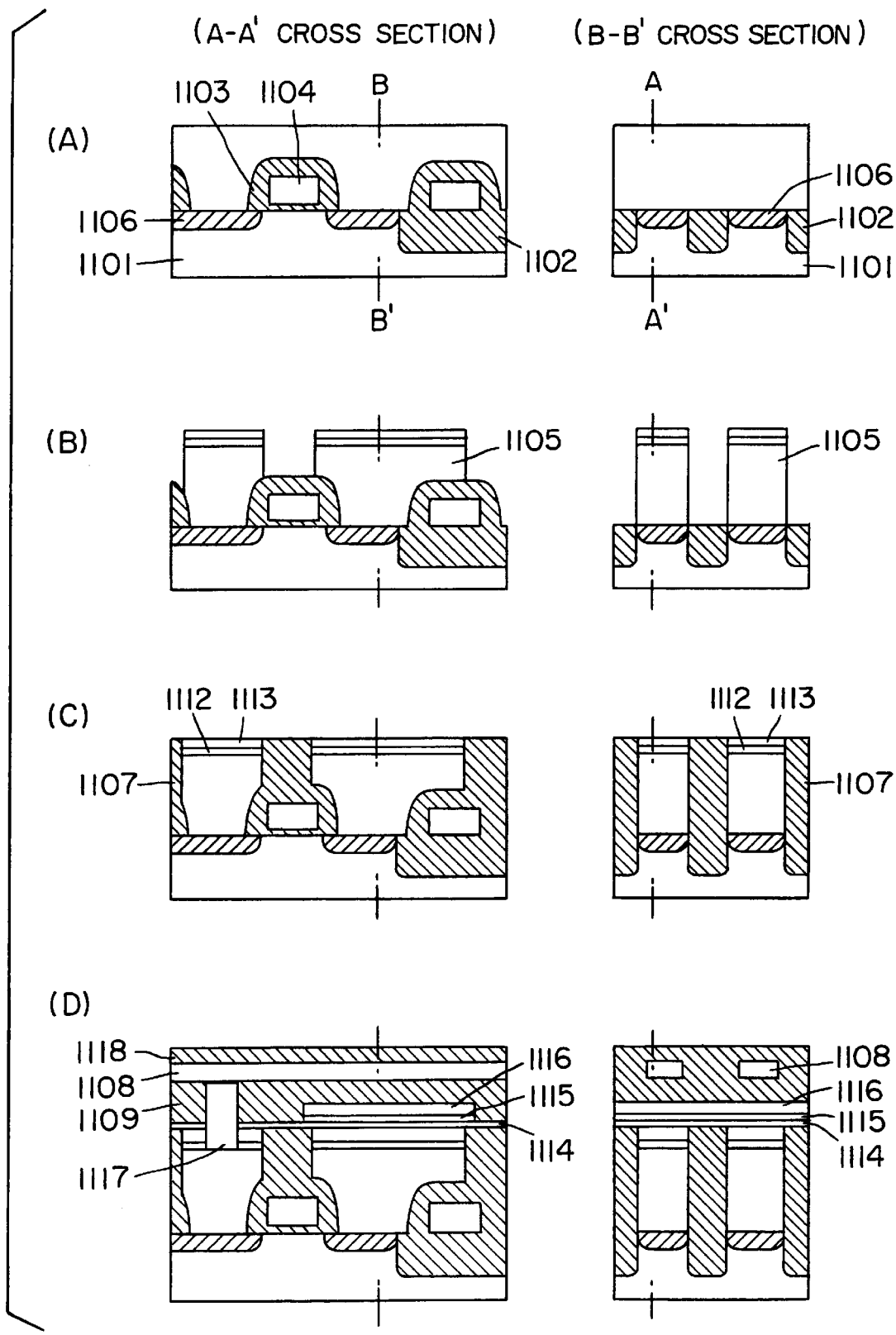
FIGS. 11A through 11D are schematic diagrams of a ferroelectric memory cell made in Example 5.

FIG. 11A shows the aspect in which, after making the transistor portion of the memory cell by a known method, selective epitaxial growth of the single-crystal Si layer 1105 and planation by chemical-mechanical polishing (CMP) have just finished. In that case, a silicon oxide film was used as the insulating film of the word line 1104. Further, for the purpose of removing the damaged layer produced on the surface of the electrode on the Si substrate in a RIE process, after etching using vapor of hydrogen fluoride, the substrate was directly transported in vacuum into a CVD chamber, and selective epitaxial growth was conducted at 750° C. by using $SiH_4$ gas with the pressure of 1 mTorr and $AsH$ gas of 0.1 mTorr added as a donor.

Next as shown in FIG. 11B, for the purpose of the damaged layer produced in the CMP process from the surface of the single-crystal Si layer, after etching using vapor of hydrogen fluoride, a (Ti, Al)N film was stacked as the barrier metal 1112 by known reactive sputtering at 60° C., and the barrier metal and the single-crystal Si layer were patterned by known lithography and RIE using the same mask. Upon etching the single-crystal Si layer, an oxide film was used as an etching stopper.

Next as shown in FIG. 11C, the silicon oxide insulating film 1107 is buried in grooves made by patterning by plasma CVD using TEOS as a source material gas, and planation was conducted by CMP using the $SrRuO_3$ layer, which is the lower electrode, as a stopper.

After that, as shown in FIG. 11D, after first removing the damaged layer produced during CMP on the surface of the $SrRuO_3$ by reversive sputtering, a $BaTiO_3$ thin film 1114 was grown to the thickness of 40 nm at 600° C. by using the sputtering apparatus shown in FIGS. 7A through 7C and applying an RF power of 13.56 MHz to the substrate holder so as to maintain the potential of the substrate holder at –5V. Thereafter, formed on the capacitor dielectric film was a $SrRuO_3$ film as the upper electrode 1115 by known sputtering, and an Al electrode as the driveline 1116 was formed by sputtering at the room temperature and thereafter patterned. Further, by a known method, the via plug 1117 and the bit line 1108 were made. The film orientation was measured with an X-ray diffraction apparatus, and it was confirmed that all of the (Ti, Al)N barrier film, $SrRuO_3$ film and $BaTiO_3$ dielectric film grew in the (001) orientation. Additionally, the dielectric property of the ferroelectric thin-film capacitor, obtained, was measured, and it was confirmed that a value of remanent polarization as large as $2Pr=65$ $\mu C/cm^2$ was obtained, it would function as a ferroelectric capacitor, and it would operate as nonvolatile semiconductor memory.

Example 6 and Comparative Example 3

This is an example of application of the invention to fabrication of a magnetic material.

Using the sputtering apparatus shown in FIGS. 7A through 7C and applying RF power of 13.56 MHz to the substrate holder to maintain the potential of the substrate holder at –5V, composite perovskite $Sr_2MoFeO_6$, which is a conductive oxide magnetic material, was grown on the $SrTiO_3$ substrate at 600° C. thereby to obtain a 20 nm thick film (Example 6). Through X-ray diffraction, the film exhibited the surface lattice constant of a=3.91 Å and vertical lattice constant of c=4.01 Å, and substantially no relaxation in lattice constant on the plane was observed. This film exhibited a high conductivity, and through measurement of the magnetic transition point with a SQUID susceptometer, the Curie temperature of 170° C. was confirmed.

On the other hand, in a film of the same type (Comparative Example 3) prepared by here again using the sputtering apparatus shown in FIGS. 7A through 7C without applying RF power to the substrate holder, surface lattice constant of a=3.95 Å and vertical lattice constant of c=3.99 Å were obtained. Although this film exhibited conductivity, its magnetic transition temperature was 110° C. Tunneling type magneto resistive elements were made by using these films and changing ratios of their magneto resistive forces were measure at the room temperature. As a result, although Example 6 exhibited the changing ratio of 19%, the changing ratio of Comparative Example 3 was only 6%.

As described above, according to the invention, it is possible to make epitaxially strained lattices of an oxide such as ferroelectric material with a good crystalline property uniformly over a substrate with a large area.

What is claimed is:

1. A method of manufacturing an epitaxially-strained lattice film of an oxide on a substrate by sputtering in vapor phase at least a part of film components from a target onto the substrate, comprising:
    (1) using a parallel-flat sputtering apparatus in which the substrate and the target are positioned face to face, and when a gas pressure during deposition is P (Pa) and the distance between the substrate and the target is L (mm), maintaining the product of P and L not smaller than 500; and
    (2) stacking the epitaxially-strained lattice film by sputtering while applying RF power to a substrate in order to maintain a DC bias potential of a substrate holder between +5V and –30V.

2. A method of manufacturing an epitaxially-strained lattice film of an oxide on a substrate by sputtering in vapor phase at least a part of film components from a target onto the substrate, comprising:
    (1) using a sputtering apparatus having a plurality of targets opposed to the substrate, shield plates located vertically above surfaces of the targets in position fixed with respect to the targets, and a mechanism for relatively rotating the entirety of the targets and the shield plates, and the substrate; and
    (2) stacking the epitaxially-strained lattice film by sputtering while applying RF power to the substrate in order to maintain a DC bias potential of a substrate holder between +5V and –30V.

3. A method of manufacturing an epitaxially-strained lattice film of an oxide on a substrate by sputtering in vapor phase at least a part of film components from a target onto the substrate, comprising:
    (1) using an offset or off-axis sputtering apparatus in which the substrate is not positioned in a region vertically above the target plane; and
    (2) stacking the epitaxially-strained lattice film by sputtering while applying RF power to a substrate in order to maintain a DC bias potential of the substrate holder between +5V and –30V.

4. A method of manufacturing an epitaxially-strained lattice film of an oxide on a substrate by sputtering in vapor phase at least a part of film components from a target onto the substrate, comprising:

(1) preventing damage to the strained lattice film by oxygen negative ions; and (2) stacking the epitaxially-strained lattice film while applying RF power to the substrate in order to maintain a DC bias potential of the substrate between +5V and −30V.

5. The method of manufacturing an epitaxially-strained lattice film of an oxide according to claim 4, wherein the epitaxially-strained lattice film is stacked while the temperature of the substrate is maintained not lower than 350° C.

6. The method of manufacturing an epitaxially-strained lattice film of an oxide according to claim 4, wherein a c-axis length Ce of the epitaxially-strained lattice film after epitaxial growth and a c-axis length of a tetragonal structure or an a-axis of a cubic structure of an oxide having a non-strained lattice structure Co satisfy the relation:

$$Ce/Co \geq 1.01.$$

7. The method of manufacturing an epitaxially-strained lattice film of an oxide according to claim 6, wherein the epitaxially-strained lattice film of an oxide has a structure selected from the group consisting of a perovskite structure and a layered perovskite structure.

8. The method of manufacturing an epitaxially-strained lattice film of an oxide according to claim 7, wherein the epitaxially-strained lattice film of an oxide is a ferroelectric film of a perovskite structure containing $(Ba, Sr, Ca)TiO_3$ as a major component thereof.

9. The method of manufacturing an epitaxially-strained lattice film of an oxide according to claim 4, wherein the DC bias potential of the RF power is controlled between +5V and −20V.

10. The method of manufacturing an epitaxially-strained lattice film of an oxide according to claim 4, wherein a magnetic field is applied near the substrate.

11. The method of manufacturing an epitaxially-strained lattice film of an oxide according to claim 4, wherein RF powers different in frequency are selected for the target and the substrate, respectively.

* * * * *